(12) United States Patent
Jeong et al.

(10) Patent No.: US 11,600,515 B2
(45) Date of Patent: Mar. 7, 2023

(54) DIE PICKUP MODULE AND DIE BONDING APPARATUS INCLUDING THE SAME

(71) Applicants: Semes Co., Ltd., Chungcheongnam-do (KR); Samsung Electronics Co., Ltd., Gyeonggi-do (KR)

(72) Inventors: Chang Bu Jeong, Gyeonggi-do (KR); Min Gu Lee, Chungcheongnam-do (KR); Eui Sun Choi, Seoul (KR); Kang San Lee, Gyeonggi-do (KR); Dae Ho Min, Seoul (KR); Seung Dae Seok, Gyeonggi-do (KR)

(73) Assignees: Semes Co., Ltd, Chungcheongnam-do (KR); Samsung Electronics Co., Ltd., Gyeonggi-do (KR)

( * ) Notice: Subject to any disclaimer, the term of this patent is extended or adjusted under 35 U.S.C. 154(b) by 210 days.

(21) Appl. No.: 17/002,009

(22) Filed: Aug. 25, 2020

(65) Prior Publication Data

US 2021/0066112 A1    Mar. 4, 2021

(30) Foreign Application Priority Data

Aug. 27, 2019    (KR) ........................ 10-2019-0105310

(51) Int. Cl.
*H01L 21/683* (2006.01)
*H01L 21/687* (2006.01)
*H01L 21/673* (2006.01)

(52) U.S. Cl.
CPC ...... *H01L 21/6838* (2013.01); *H01L 21/6732* (2013.01); *H01L 21/68714* (2013.01)

(58) Field of Classification Search
CPC ............ H01L 21/6732; H01L 21/6838; H01L 21/68741
See application file for complete search history.

(56) References Cited

U.S. PATENT DOCUMENTS 5,169,196 A    12/1992  Safabakhsh
6,760,968 B2    7/2004  Mimata et al.
(Continued)

FOREIGN PATENT DOCUMENTS

JP    05277977 A    10/1993
KR    20010007245 A    1/2001
(Continued)

OTHER PUBLICATIONS

Korean Office Action issued in Korean Patent Application No. 10-2019-0105310, dated Jan. 12, 2021, 8 pages.

*Primary Examiner* — Saul Rodriguez
*Assistant Examiner* — Brendan P Tighe
(74) *Attorney, Agent, or Firm* — RatnerPrestia

(57) ABSTRACT

Provided are a die pickup module and a die bonding apparatus including the same. The die pickup module includes a wafer stage for supporting a wafer including dies attached on a dicing tape, a die ejector arranged under the dicing tape and for separating a die to be picked up from the dicing tape, a non-contact picker for picking up the die in a non-contact manner so as not to contact a front surface of the die, a vacuum gripper for partially vacuum adsorbing a rear surface of the die picked up by the non-contact picker and an inverting driving unit for inverting the vacuum gripper to invert the die so that a rear surface of the die gripped by the vacuum gripper faces upward.

18 Claims, 20 Drawing Sheets

(56) References Cited

U.S. PATENT DOCUMENTS

| | | | |
|---|---|---|---|
| 9,142,532 B2 | 9/2015 | Suga et al. | |
| 10,468,373 B2* | 11/2019 | Colosimo, Jr. | H01L 24/00 |
| 2002/0046460 A1* | 4/2002 | Mimata | H01L 24/75 |
| | | | 29/840 |
| 2009/0175705 A1* | 7/2009 | Nakao | H01L 21/68707 |
| | | | 269/21 |
| 2015/0321321 A1* | 11/2015 | Kim | B24B 41/005 |
| | | | 269/21 |

FOREIGN PATENT DOCUMENTS

| | | |
|---|---|---|
| KR | 20150006845 A | 1/2015 |
| KR | 20170044993 A2 | 4/2017 |
| KR | 20190009510 A | 1/2019 |
| KR | 20190012112 A | 2/2019 |
| KR | 20190034858 A | 4/2019 |

* cited by examiner

[FIG. 1]
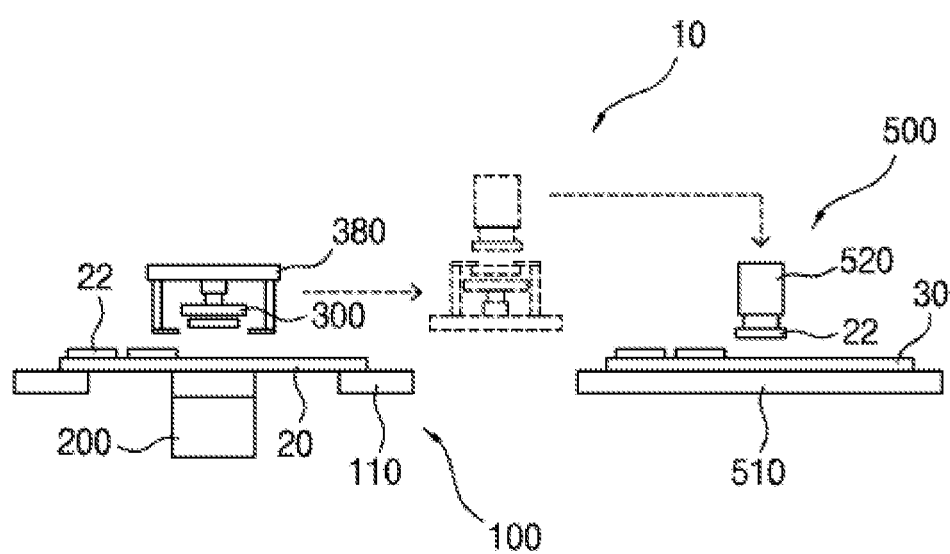

[FIG. 2]
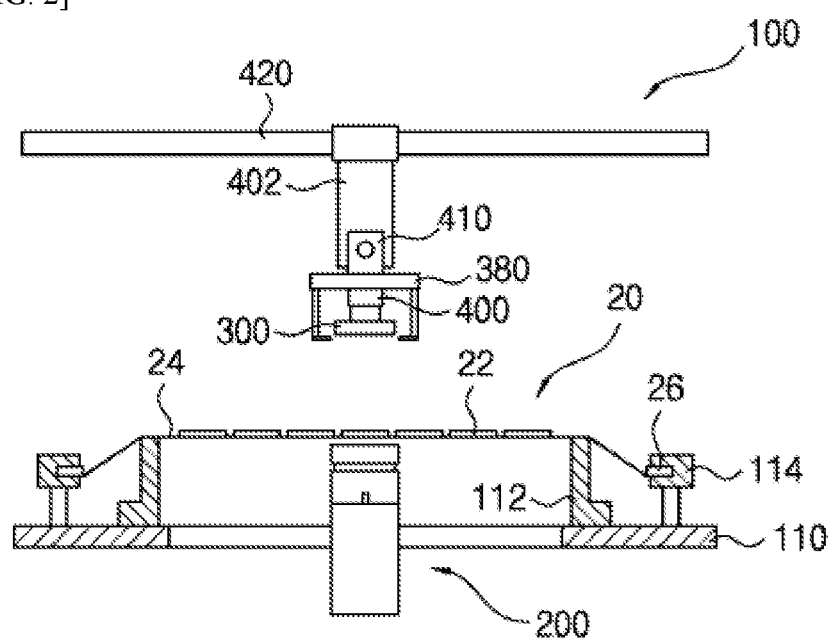

[FIG. 3]
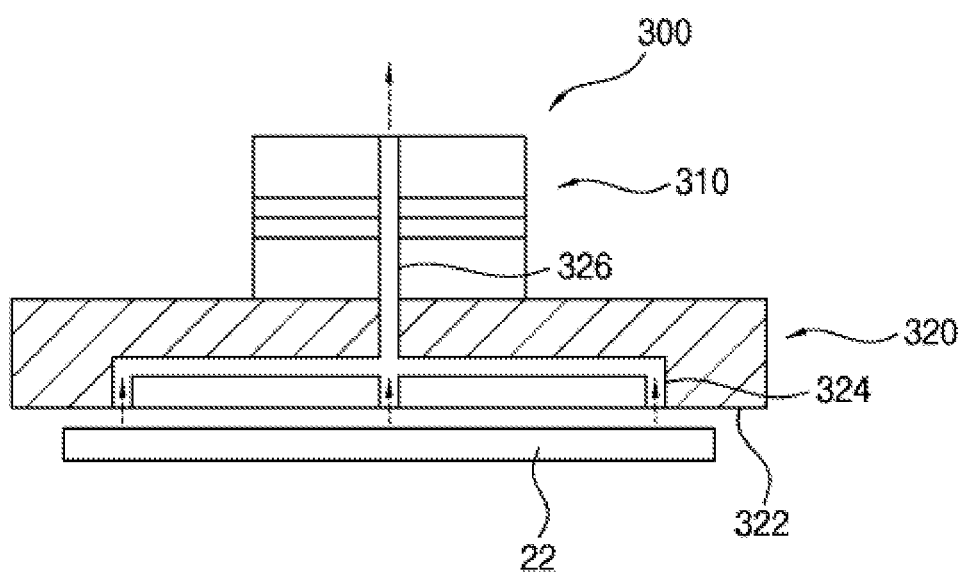

[FIG. 4]
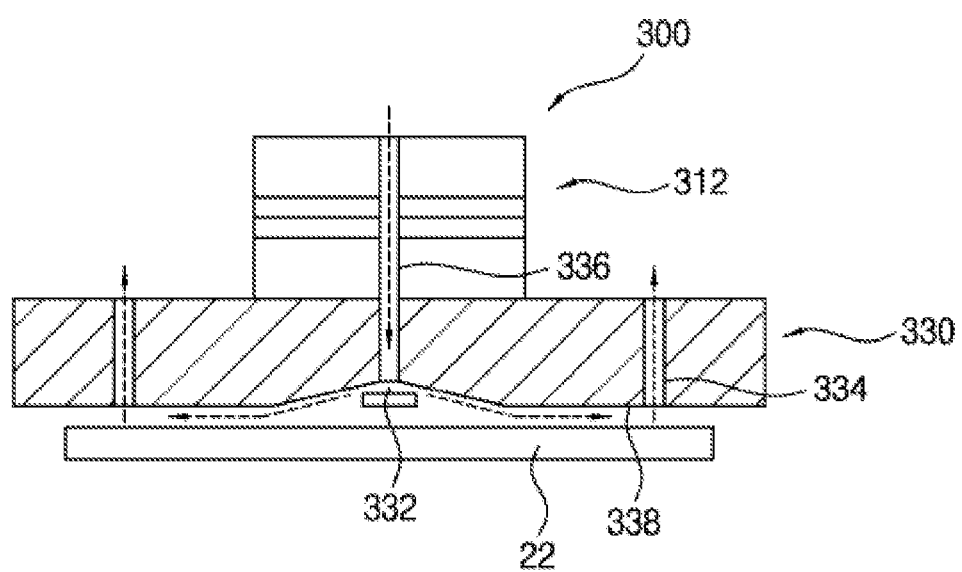

[FIG. 5]
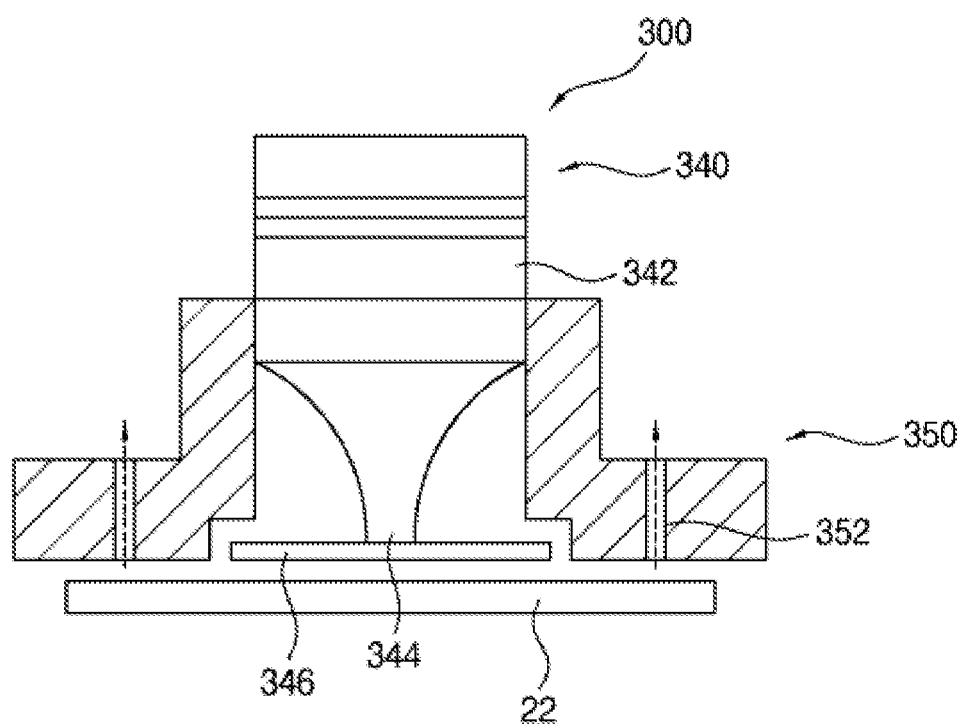

[FIG. 6]
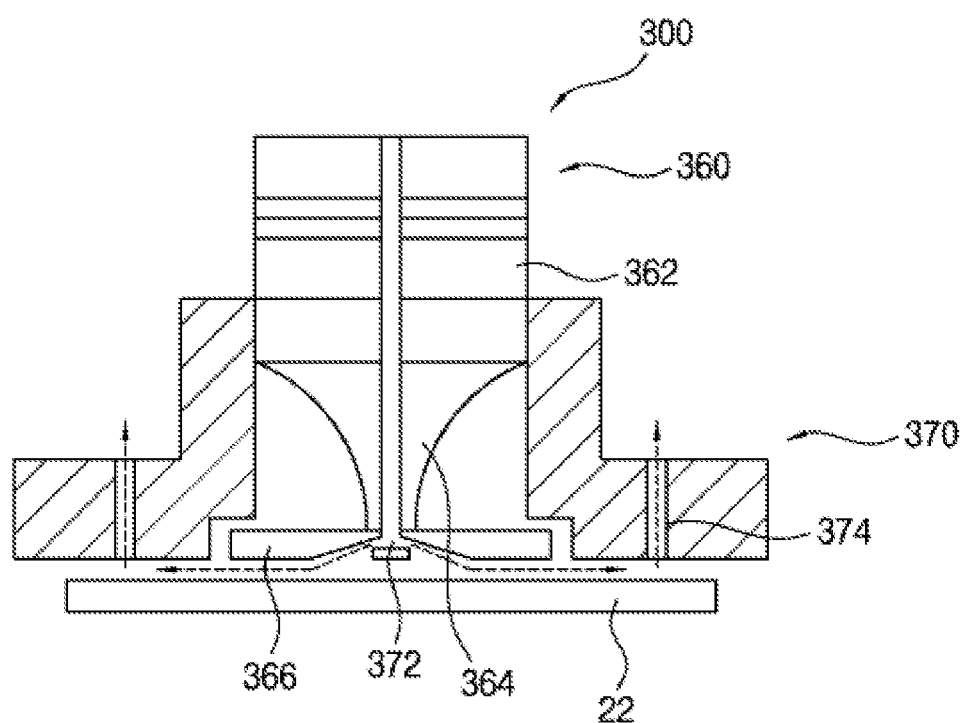

[FIG. 7]
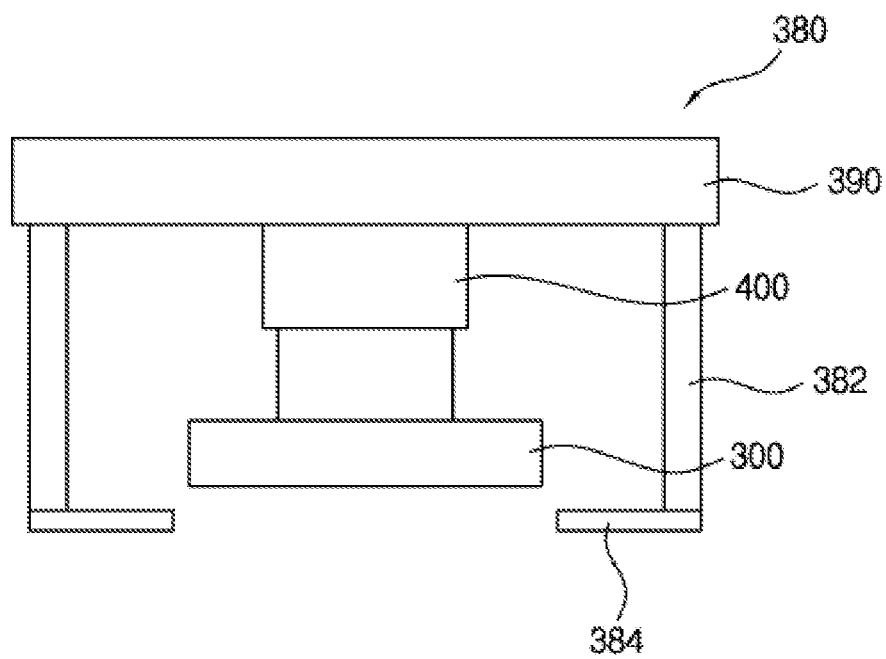

[FIG. 8]
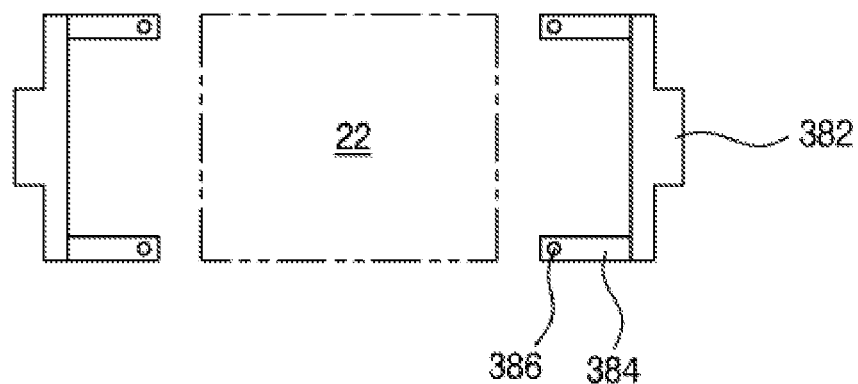

[FIG. 9]
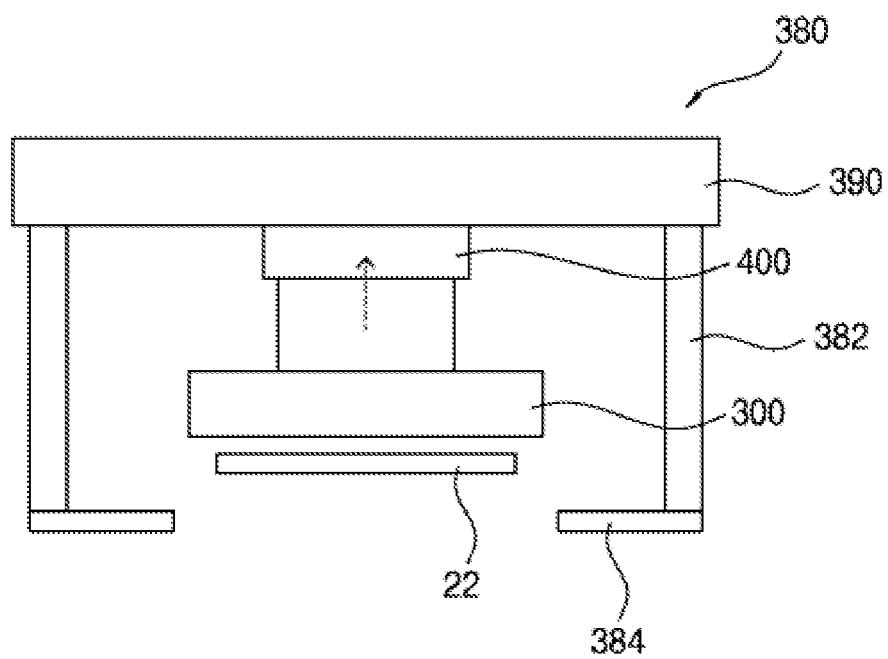

[FIG. 10]
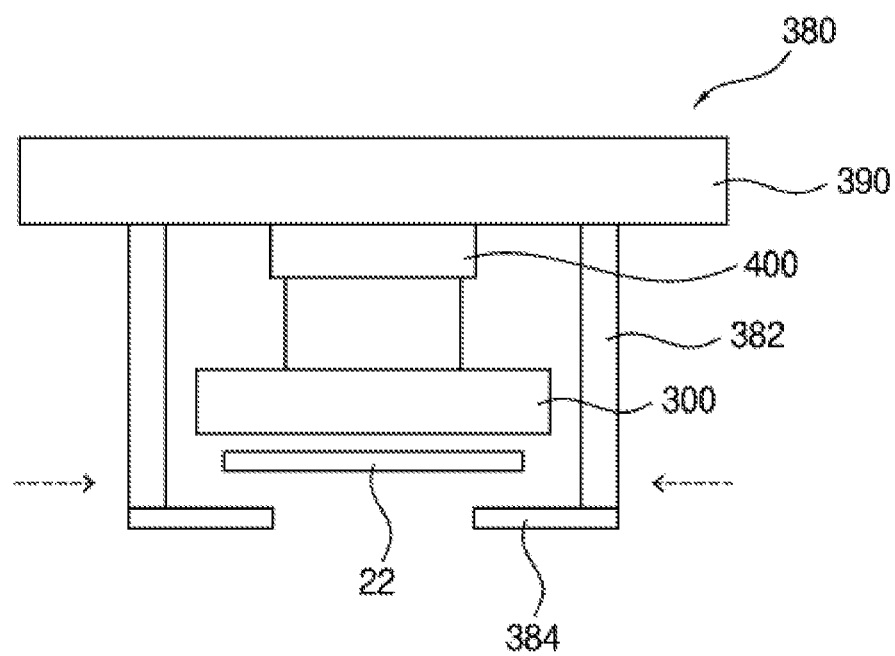

[FIG. 11]
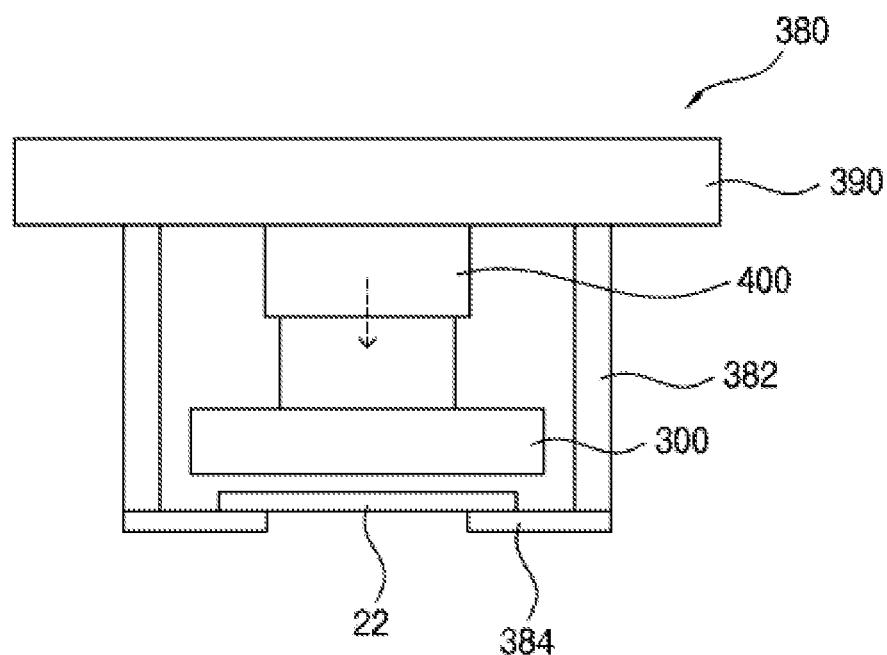

[FIG. 12]
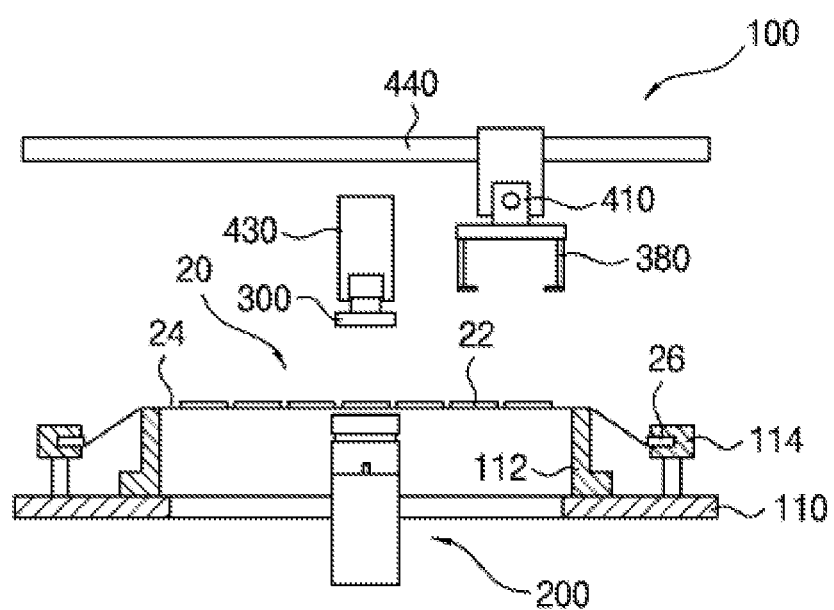

[FIG. 13]
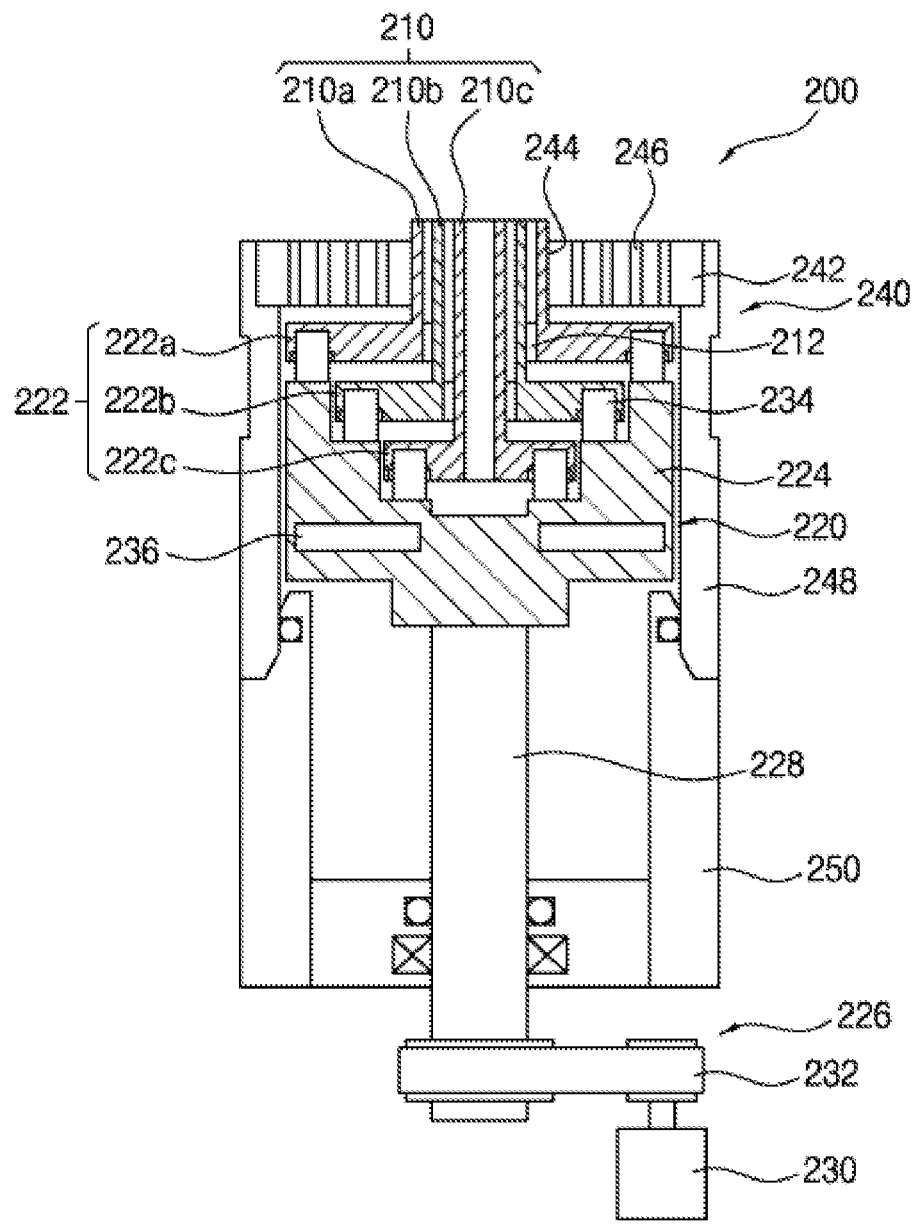

[FIG. 14]
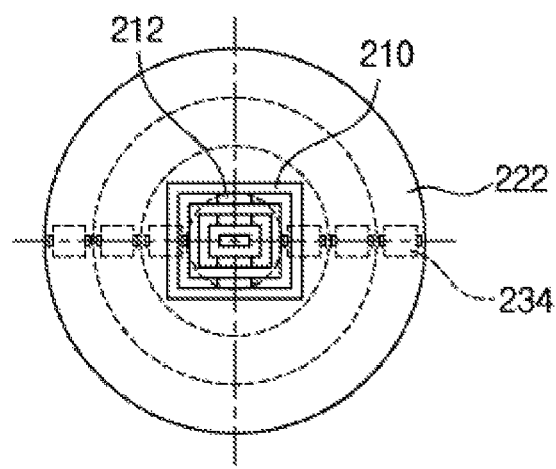

[FIG. 15]
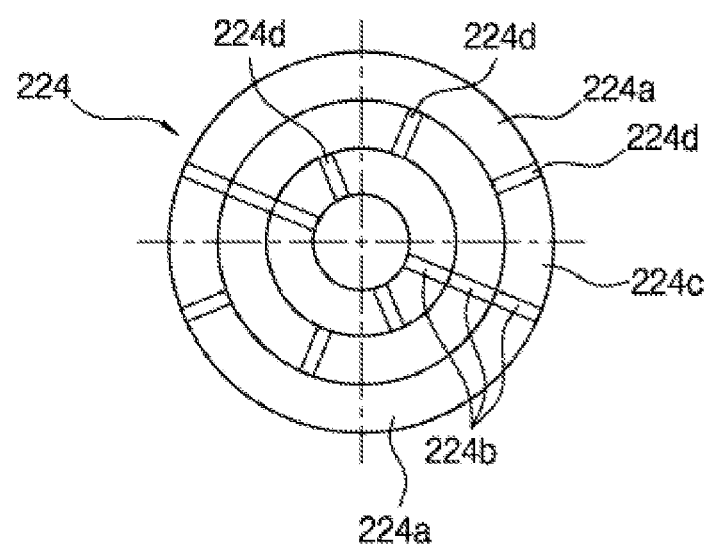

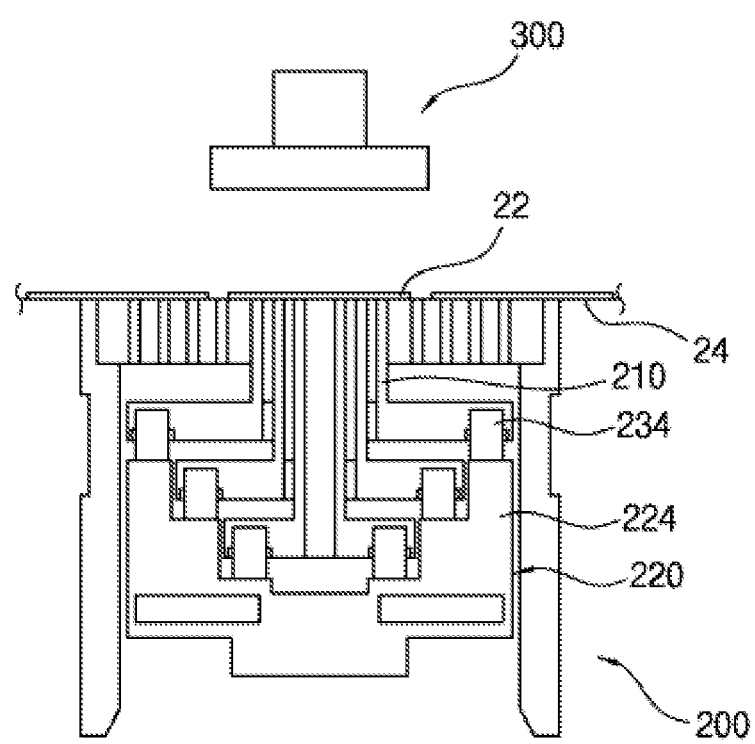
[FIG. 16]

[FIG. 17]
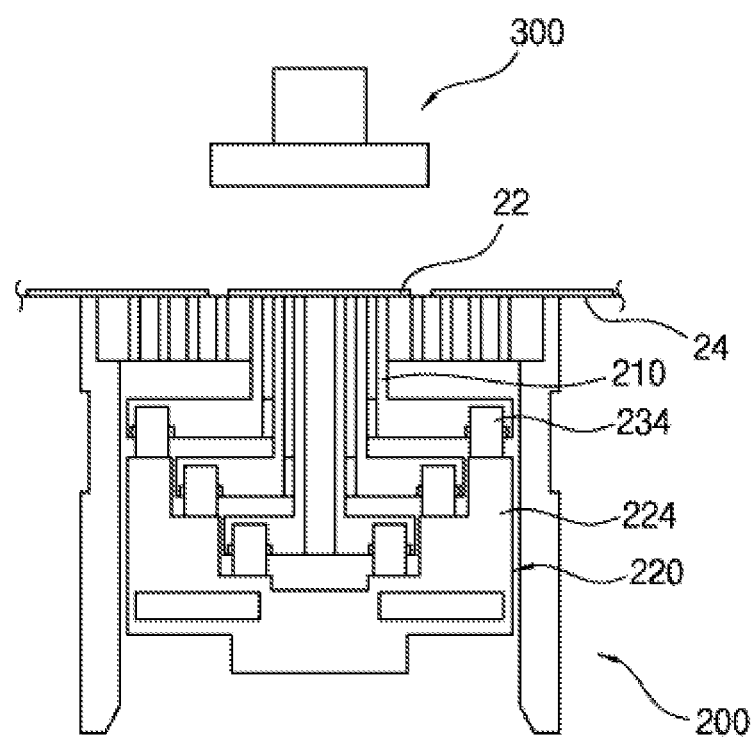

[FIG. 18]
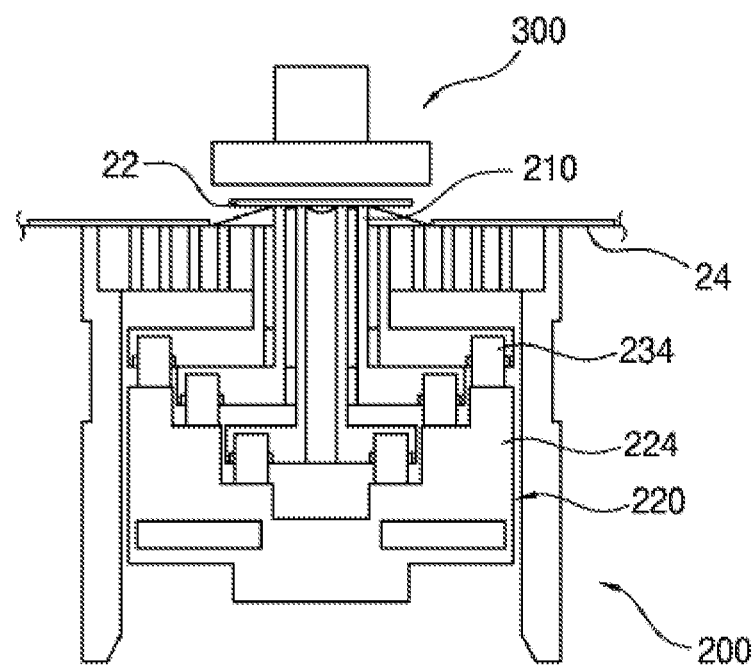

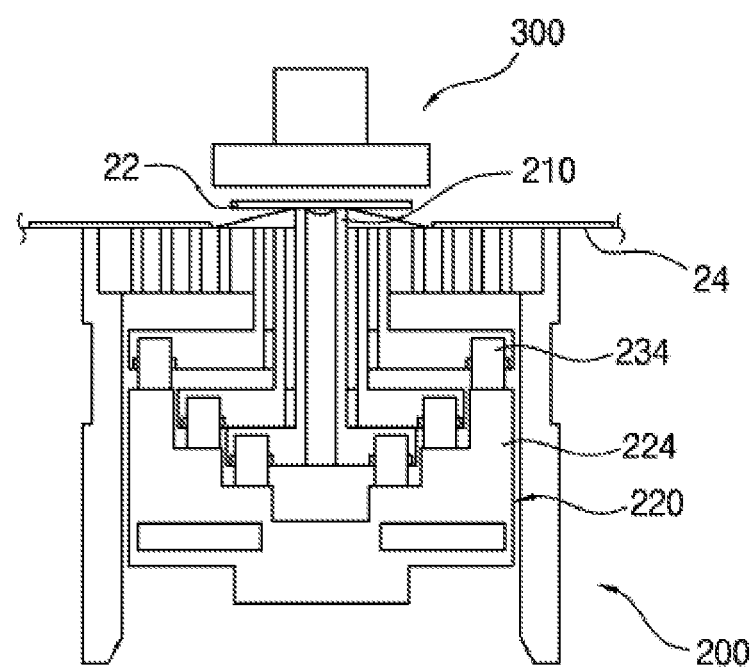
[FIG. 19]

[FIG. 20]
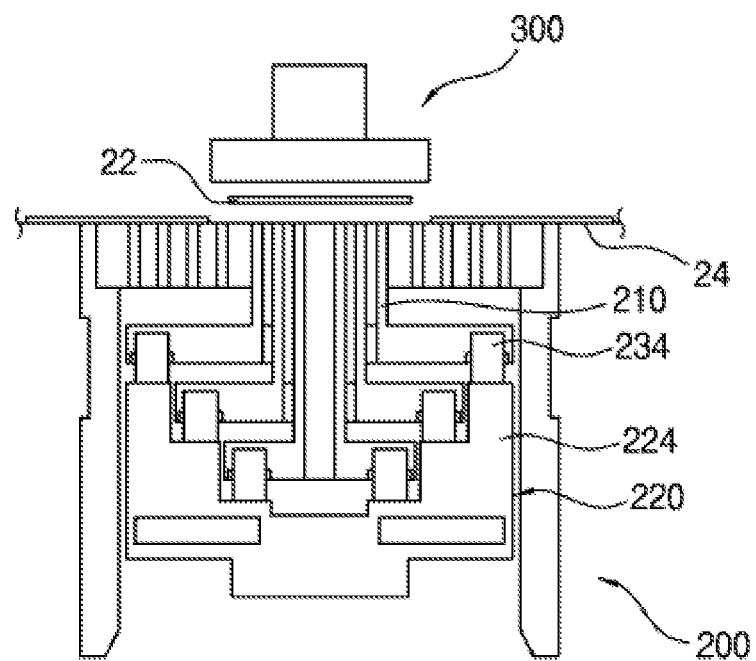

DIE PICKUP MODULE AND DIE BONDING APPARATUS INCLUDING THE SAME

CROSS-REFERENCE TO RELATED APPLICATIONS

This patent application claims the benefit of Korean Patent Application No. 2019-0105310, filed on Aug. 27, 2019, which is hereby incorporated by reference in its entirety into this application.

BACKGROUND

Field

The present invention relates to a substrate processing apparatus.

Description of the Related Art

Embodiments of the present invention relates to a die pickup module and a die bonding apparatus including the same. More particularly, the present invention relates to a die pickup module for picking up a die attached on a dicing tape in a manufacturing process of a semiconductor device, and a die bonding apparatus for bonding a die picked up by the die pickup module on a substrate.

In general, semiconductor devices can be formed on a silicon wafer used as a semiconductor substrate by repeatedly performing a series of manufacturing processes. The wafer, on which the semiconductor elements are formed, can be individualized into a plurality of dies through a dicing process, and the individualized dies through the dicing process can be bonded on a substrate such as a lead frame, a printed circuit board, and a semiconductor wafer through a die bonding process. The apparatus for performing the die bonding process may comprise a die pickup module for picking up and separating the dies from the wafer divided into the dies, and a die bonding module for attaching the picked up die on a substrate. The die pickup module may include a stage unit for supporting the wafer and a die ejector for selectively separating a die from the wafer supported on the stage unit, and a picker for picking up the die from the wafer and transmitting it to the die bonding module. The die bonding module may include a substrate stage for supporting the substrate and a bonding head for vacuum adsorbing the die and bonding it on the substrate.

Recently, as the degree of integration of semiconductor devices increases, the pad pitch on the die is gradually decreasing, and the problem that the front surface portion of the die bonded on the substrate is contaminated in the die bonding process has emerged as a problem to be solved. In particular, in the case of a through silicon via (TSV) bonding process for manufacturing a stacked semiconductor device, a plurality of electrode pads may be arranged on the front surface of the die, and contamination caused by contact in the process of being picked up from the wafer by the picker may occur.

[Prior Art]
(Patent 1) Korean Patent Publication No. 10-2019-0034858 (publication date: Apr. 3, 2019)

SUMMARY

The object of the embodiments of the present invention is to provide a multivalent pickup module capable of preventing contamination of a die in a die pickup process and a die bonding apparatus including the same.

A die pickup module according to an aspect of the present invention for achieving the above object may comprise a wafer stage for supporting a wafer including dies attached on a dicing tape, a die ejector arranged under the dicing tape and for separating a die to be picked up from the dicing tape, a non-contact picker for picking up the die in a non-contact manner so as not to contact a front surface of the die, a vacuum gripper for partially vacuum adsorbing a rear surface of the die picked up by the non-contact picker, and an inverting driving unit for inverting the vacuum gripper to invert the die gripped by the vacuum gripper.

According to some embodiments of the present invention, the non-contact picker may comprise an ultrasonic vibration unit for maintaining the die in a non-contact state using ultrasonic vibration.

According to some embodiments of the present invention, the non-contact picker may comprise an ultrasonic vibration unit that provides repulsive force for pushing the die using ultrasonic vibration and a vacuum chuck that provides suction force to the die using vacuum pressure so that the die is maintained in a non-contact state.

According to some embodiments of the present invention, the non-contact picker may comprise an ultrasonic vibration unit that provides repulsive force for pushing the die using ultrasonic vibration and a Bernoulli chuck that forms a flow of air on the die so that the die is maintained in a non-contact state and provides suction force to the die by using negative pressure generated by the flow of air.

According to some embodiments of the present invention, the ultrasonic vibration unit may comprise an ultrasonic vibrator for generating the ultrasonic vibration, a horn for transmitting the ultrasonic vibration and a vibration plate connected to the horn and vibrated by the ultrasonic vibration.

According to some embodiments of the present invention, the vacuum chuck is coupled to an end of the ultrasonic vibration unit and has vacuum holes for forming the suction force, and the vacuum holes may be connected to a vacuum pump through a vacuum line passing through the ultrasonic vibration unit.

According to some embodiments of the present invention, the Bernoulli chuck has an air injection nozzle coupled to an end of the ultrasonic vibration unit and for forming the flow of air, and vacuum holes for sucking air injected from the air injection nozzle, and the air injection nozzle may be connected to an air supplying unit for supplying the air through an air line passing through the ultrasonic vibration unit.

According to some embodiments of the present invention, the vacuum gripper includes a gripper arm configured in a fork shape, and the gripper arm includes finger members having a vacuum hole for vacuum adsorbing rear surface edge portions of the die.

According to some embodiments of the present invention, the vacuum gripper may comprise a pair of gripper arms for vacuum adsorbing rear surface edge portions of the die and a gripper driving unit for moving the gripper arms in a direction closer to each other and a direction away from each other.

According to some embodiments of the present invention, the die pickup module may further include a vertical driving unit mounted on the gripper driving unit and for moving the non-contact picker in a vertical direction to pick up the die.

According to some embodiments of the present invention, the die pickup module may further comprise a vertical driving unit for moving the non-contact picker in a vertical direction to pick up the die, and a horizontal driving unit for moving the vacuum gripper in a horizontal direction to receive the die picked up by the non-contact picker.

According to some embodiments of the present invention, the die ejector may comprise ejector members arranged in a telescope shape and an ejector driving unit for simultaneously raising the ejector members and sequentially descending the ejector members one by one from outside to inside.

According to some embodiments of the present invention, the ejector driving unit may comprise disk-shaped flanges formed at a lower end of the ejector members in a horizontal direction, arranged in a vertical direction, and having a diameter gradually increasing upward, a driving head arranged in a lower portion of the flanges and having circular ring-shaped upper surfaces respectively facing lower surfaces of the flanges, a head driving unit for rotating the driving head and cam followers mounted in a lower portion of the flanges and placed on upper surfaces of the driving head, wherein the upper surfaces of the driving head may include first inclined surfaces for simultaneous raise of the ejector members and second inclined surfaces for sequential descend of the ejector members.

According to some embodiments of the present invention, the driving head may comprise a permanent magnet for providing magnetic force so that the cam followers are in close contact with upper surfaces of the driving head.

According to some embodiments of the present invention, the die ejector may further comprise stopper members for maintaining a gap between the ejector members.

According to some embodiments of the present invention, the die ejector may further comprise a hood having an opening, into which the ejector members are inserted, and vacuum holes for vacuum adsorbing the dicing tape, and an ejector body coupled to the hood and in a cylinder shape with a closed lower portion.

A die bonding apparatus according to another aspect of the present invention for achieving the above object may comprise a die pickup module for picking up a die to be picked up from a wafer including dies attached on a dicing tape and inverting the picked up die, and a die bonding module for bonding a die inverted by the die pickup module on a substrate, wherein the die pickup module may comprise a wafer stage for supporting the wafer, a die ejector arranged under the dicing tape and for separating the die from the dicing tape, a non-contact picker for picking up the die in a non-contact manner so as not to contact with a front surface of the die, a vacuum gripper for partially vacuum adsorbing a rear surface of the die picked up by the non-contact picker and an inverting driving unit for inverting the vacuum gripper to invert the die so that a rear surface of the die gripped by the vacuum gripper faces upward.

According to the embodiments of the present invention as described above, the non-contact picker may pick up the die in a non-contact manner using the repulsive force provided by the ultrasonic vibration unit and the suction force provided by the vacuum chuck or the Bernoulli chuck. And the picked up die can be transmitted onto a vacuum gripper. The vacuum gripper may partially vacuum adsorb the rear surface of the die, and the inverting driving unit may invert the vacuum gripper to invert the die. The bonding head may be picked up by vacuum adsorption of the rear surface of the inverted die, and a bonding step may be performed such that the front surface of the die is attached onto the substrate. As described above, contamination of the front surface of the die can be prevented by inverting the die while picking up the die in a non-contact manner and vacuum adsorbing the rear surface of the die, thereby bonding failure due to contamination of the front surface of the die or electrical defects between electrode pads due to contamination can be sufficiently prevented.

BRIEF DESCRIPTION OF THE DRAWINGS

FIG. 1 is a schematic diagram for describing a die pickup module and a die bonding apparatus including the same according to an embodiment of the present invention.

FIG. 2 is a schematic diagram for describing the die pickup module shown in FIG. 1.

FIG. 3 is a schematic cross-sectional view for describing an example of the non-contact picker shown in FIG. 2.

FIG. 4 is a schematic cross-sectional view for describing another example of the non-contact picker shown in FIG. 2.

FIG. 5 is a schematic cross-sectional view for describing another example of the non-contact picker shown in FIG. 2.

FIG. 6 is a schematic cross-sectional view for describing another example of the non-contact picker shown in FIG. 2.

FIG. 7 is a schematic diagram for describing a non-contact picker and a vacuum gripper shown in FIG. 2.

FIG. 8 is a schematic plan view for describing the gripper arms shown in FIG. 7.

FIGS. 9 to 11 are schematic diagrams for describing the operation of the non-contact picker and the vacuum gripper shown in FIG. 2.

FIG. 12 is a schematic diagram for describing another example of the non-contact picker and the vacuum gripper shown in FIG. 2.

FIG. 13 is a schematic cross-sectional view for describing the die ejector shown in FIG. 2.

FIG. 14 is a schematic plan view for describing ejector members and flanges shown in FIG. 13.

FIG. 15 is a schematic plan view for describing the driving head shown in FIG. 13.

FIGS. 16 to 20 are schematic diagrams for describing a method of picking up a die using the non-contact picker and the die ejector shown in FIG. 2.

DETAILED DESCRIPTION

Hereinafter, embodiments of the present invention will be described in detail with reference to the accompanying drawings. However, the present invention should not be configured as limited to the embodiments described below, but may be embodied in various other forms. The following embodiments are provided to sufficiently convey the scope of the present invention to those skilled in the art of the present invention rather than to make the present invention to be wholly completed.

In the embodiments of the present invention, when one element is described as being arranged on or connected to another element, the element may be arranged or connected directly on the other element, and other elements may be interposed between them. Alternatively, if one element is described as being arranged or connected directly on the other element, there cannot be another element between them. Terms such as first, second, third, etc. may be used to describe various items such as various elements, compositions, regions, layers and/or parts, but the items are not limited by these terms.

The terminology used in the embodiments of the present invention is used for the purpose of describing specific embodiments only, and is not intended to limit the present invention. Further, unless limited otherwise, all terms including technical and scientific terms have the same meaning that can be understood by those of ordinary skill in the art. These terms, such as those defined in conventional dictionaries, will be construed to have meanings consistent with their meanings in the context of the description of the invention and the related art, it will not be interpreted ideally or excessively intuition, unless explicitly defined.

Embodiments of the invention are described with reference to schematic diagrams of ideal embodiments of the invention. Accordingly, changes from the shapes of the diagrams, for example, changes in manufacturing methods and/or tolerances, can be expected sufficiently. Accordingly, the embodiments of the present invention are not limited to specific shapes of regions described as diagrams, but include variations in shapes, and the elements described in the diagrams are entirely schematic and their shapes are not intended to describe the exact shape of the elements and are not intended to limit the scope of the invention.

FIG. 1 is a schematic diagram for describing a die pickup module and a die bonding apparatus including the same according to an exemplary embodiment of the present invention, and FIG. 2 is a schematic diagram for describing the die pickup module shown in FIG. 1.

Referring to FIGS. 1 and 2, the die pickup module 100 and the die bonding apparatus 10 including the same according to an embodiment of the present invention can be used for picking up dies 22 individualized by a dicing process in a semiconductor device manufacturing process and bonding them on a substrate 30 such as a lead frame, a printed circuit board, a semiconductor wafer, or the like.

The die bonding apparatus 10 may comprise a die pick up module 100 for picking up the die 22 to be picked up from the wafer 20 including the dies 22 and inverting the picked up die 22, and a die bonding module 500 for bonding the die 22 inverted by the die pickup module 100 on the substrate 30.

The wafer 20 may comprise dies 22 that are individualized by a dicing process, and the dies 22 may be provided in a state attached to the dicing tape 24. In particular, the dies 22 may be attached on the dicing tape 24 with the rear surface of the dies 22 so that the front surface of the dies 22 face upward, and the dicing tape 24 can be mounted on the mount frame 26 of a substantially circular ring shape.

The die pickup module 100 may comprise a wafer stage 110 for supporting the wafer 20, a die ejector 200 arranged under the dicing tape 24 and for separating the die 22 from the dicing tape 24, a non-contact picker 300 for picking up the die 22 in a non-contact manner so as not to contact a front surface of the die 22 in order to prevent contamination of the front surface portion of the die 22, a vacuum gripper 380 for partially vacuum adsorbing a rear surface of the die 22 picked up by the non-contact picker 300, and an inverting driving unit 410 for inverting the vacuum gripper 380 to invert the die 22 so that the rear surface of the die 22 gripped by the vacuum gripper 380 faces upward.

The die bonding module 500 may comprise a substrate stage 510 for supporting the substrate 30, a bonding head 520 for picking up the inverted die 22 from the vacuum gripper 380 and bonding it on the substrate 30, a head driving unit (not shown) for picking up the die 22 and moving the bonding head 520 in vertical and horizontal directions to bond the die 22 on the substrate 30. As an example, the die pickup module 100 may include a horizontal driving unit 420 for moving the die 22 to a position adjacent to the die bonding module 500, and the head driving unit may move the bonding head 520 in vertical and horizontal directions to pick up the die 22 transferred by the horizontal driving unit 420 and bond it on the substrate 30.

On the other hand, the rear surface of the die 22 gripped by the vacuum gripper 380 and inverted by the inverting driving unit 410 may be positioned so that the rear surface faces upward and the front surface faces downward. Although not shown in detail, the bonding head 520 may include a bonding tool (not shown) for vacuum adsorbing the rear surface of the inverted die 22, and the bonding tool may include a vacuum hole for vacuum adsorbing the rear surface of the inverted die 22. As described above, the front surface of the die 22 may be picked up in a non-contact state by the non-contact picker 300, and then the rear surface may be vacuum adsorbed by the vacuum gripper 380 and then inverted by the inverting driving unit 410. Therefore, contamination of the front surface of the die 22 bonded on the substrate 30 can be sufficiently prevented.

Referring to FIG. 2, a support ring 112 for supporting the dicing tape 24 may be arranged on the wafer stage 110. For example, the support ring 112 may support the dicing tape 24 between the dies 22 and the mount frame 26. Further, clamps 114 for gripping the mount frame 26 may be arranged on the wafer stage 110. The clamps 114 may be moved downward by a clamp driving unit (not shown), thereby the dicing tape 24 may be sufficiently expanded to facilitate pick up of the dies 22.

A die ejector 200 for separating the dies 22 from the dicing tape 24 may be arranged under the dicing tape 24 supported on the wafer stage 110. For example, the die ejector 200 may partially separate the die 22 from the dicing tape 24 by raising the die 22 to be picked up using ejector members 210 (see FIG. 13), and after the die 22 is raised, the non-contact picker 300 may descend to support the die 22 in a non-contact manner. After the die 22 is supported by the non-contact picker 300, the ejector members 210 may descend, thereby allowing the die 22 to be completely separated from the dicing tape 24.

FIG. 3 is a schematic cross-sectional view for describing an example of the non-contact picker shown in FIG. 2.

Referring to FIG. 3, the non-contact picker 300 may include a vacuum chuck 320 and an ultrasonic vibration unit 310 for maintaining a die 22 to be picked up in a non-contact state using ultrasonic vibration. The vacuum chuck 320 may be mounted at one end of the ultrasonic vibration unit 310 and may provide suction force to the die 22 by using vacuum pressure. The ultrasonic vibration unit 310 may provide repulsive force to push the die 22 from the die supporting surface 322 of the vacuum chuck 320 (as shown, the lower surface of the vacuum chuck 320) using a periodic air compression effect of ultrasonic vibration. As an example, the vacuum chuck 320 may be ultrasonically vibrated by the ultrasonic vibration unit 310, and the die 22 may be supported in a non-contact state as to the vacuum chuck 320, that is, spaced apart from the die supporting surface 322 by a predetermined distance, by repulsive force generated by the ultrasonic vibration and suction force caused by the vacuum pressure.

As an example, although not shown in detail, the ultrasonic vibration unit 310 may include a pair of piezoelectric elements, and an alternating voltage may be applied to the piezoelectric elements to generate ultrasonic vibration. The ultrasonic vibration generated by the ultrasonic vibration unit 310 may be transmitted to the vacuum chuck 320, and in this case, the vacuum chuck 320 may function as a vibration plate. The vacuum chuck 320 may include a plurality of vacuum holes 324 for generating the suction force, and the magnitude and frequency of the alternating voltage and the vacuum pressure applied to the vacuum holes 324 may be appropriately adjusted in consideration of the weight of the die 22 so that the die 22 is maintained in a non-contact state.

According to an embodiment of the present invention, the ultrasonic vibration unit 310 may be mounted in the central portion of the vacuum chuck 320, and as shown, the vacuum holes 324 may be connected to a vacuum pump (not shown) through a vacuum line 326 passing through the ultrasonic vibration unit 310.

FIG. 4 is a schematic cross-sectional view for describing another example of the non-contact picker shown in FIG. 2.

Referring to FIG. 4, the non-contact picker 300 may include an ultrasonic vibration unit 312 and a Bernoulli chuck 330 for maintaining a die 22 to be picked up in a non-contact state using ultrasonic vibration. The Bernoulli chuck 330 may be mounted at one end of the ultrasonic vibration unit 312 and form a flow of air on the die 22 and use the negative pressure generated by the flow of air to provide suction force to the die 22.

The Bernoulli chuck 330 may have an air injection nozzle 332 for forming the flow of air and a plurality of vacuum holes 334 for sucking air injected from the air injection nozzle 332. As an example, the ultrasonic vibration unit 312 may be mounted in the central portion of the Bernoulli chuck 330, and as shown, the air injection nozzle 332 may be connected to an air supplying unit (not shown) for supplying the air through an air line 336 passing through the ultrasonic vibration unit 312.

In particular, the Bernoulli chuck 330 may have a die supporting surface 338 facing the die 22, and the air injection nozzle 332 may be provided in the central portion of the die supporting surface 338. The air injection nozzle 332 may inject the air toward the edge portions of the die supporting surface 338 as shown, and accordingly, the flow of air can occur radially between the die supporting surface 338 and the die 22. In this case, the vacuum holes 334 may be arranged in edge portions of the die supporting surface 338.

FIG. 5 is a schematic cross-sectional view for describing another example of the non-contact picker shown in FIG. 2.

Referring to FIG. 5, the non-contact picker 300 may include an ultrasonic vibration unit 340 and a vacuum chuck 350. The ultrasonic vibration unit 340 may comprise an ultrasonic vibrator 342 for generating ultrasonic vibration, a horn 344 for amplifying and transmitting the ultrasonic vibration, and a vibration plate 346 connected to the horn 344 and vibrated by the ultrasonic vibration. The horn 344 may be configured in a substantially conical shape to amplify ultrasonic vibration, and the vibration plate 346 may be mounted at an end of the horn 344.

The vacuum chuck 350 may be coupled to the ultrasonic vibration unit 340 and may be configured to surround the vibration plate 346. The vacuum chuck 350 may include a plurality of vacuum holes 352 for providing suction force, and the vacuum holes 352 may be arranged around the vibration plate 346. In this case, the die supporting surface may be configured with a lower surface of the vibration plate 346 facing the die 22 before being picked up and a lower surface of the vacuum chuck 350.

FIG. 6 is a schematic cross-sectional view for describing another example of the non-contact picker shown in FIG. 2.

Referring to FIG. 6, the non-contact picker 300 may include an ultrasonic vibration unit 360 and a Bernoulli chuck 370. The ultrasonic vibration unit 360 may comprise an ultrasonic vibrator 362 for generating ultrasonic vibration, a horn 364 for amplifying and transmitting the ultrasonic vibration, and a vibration plate 366 connected to the horn 364 and vibrated by the ultrasonic vibration.

The Bernoulli chuck 370 may be coupled to the ultrasonic vibration unit 360 and may be configured to surround the vibration plate 366. As an example, the Bernoulli chuck 370 may include an air injection nozzle 372 for injecting air, and the air injection nozzle 372 may be provided in a lower central portion of the vibration plate 366. In addition, the Bernoulli chuck 370 may have vacuum holes 374 for sucking air injected from the air injection nozzle 372, and the vacuum holes 374 may be arranged around the vibration plate 366. In this case, the die supporting surface may be configured with a lower surface of the vibration plate 366 facing the die 22 before being picked up and a lower surface of the Bernoulli chuck 370.

On the other hand, in the case of supporting the die 22 in a non-contact manner using the ultrasonic vibration unit 310, 312, 340, 360 and the vacuum chuck 320, 350 or the Bernoulli chuck 330, 370, a supporting force may be generated even in a direction parallel to the die supporting surface by the periodic air compression effect generated by the ultrasonic vibration units 310, 312, 340, 360, thereby the die 22 may be prevented from falling in the inverting process of the non-contact picker 300. Further, when the die supporting surface is positioned in the horizontal direction, that is, the horizontal position of the die 22 can be constantly maintained on the die supporting surface before and after the inversion, and accordingly, alignment of the bonding head 520 for picking up the inverted die 22 may be made more easily. Further, the die 22 may be picked up only by ultrasonic vibration provided by the ultrasonic vibration units 310, 312, 340, 360. Since the air compression effect by the ultrasonic vibration can generate not only repulsive force but also attractive force, non-contact pickup of the die 22 may be possible by only the ultrasonic vibration units 310, 312, 340, and 360 through structural design changes to the die supporting surface of the non-contact picker 300.

FIG. 7 is a schematic diagram for describing a non-contact picker and a vacuum gripper shown in FIG. 2, and FIG. 8 is a schematic plan view for describing the gripper arms shown in FIG. 7.

Referring to FIGS. 7 and 8, the vacuum gripper 380 may include a gripper arm 382 configured in a fork shape, and the gripper arm 382 may include finger members 384 having a vacuum hole 386 for vacuum adsorbing the rear surface edge portions of the die 22. As an example, the vacuum gripper 380 may include a pair of gripper arms 382 for vacuum adsorbing the rear surface edge portions of the die 22 and a gripper driving unit 390 for moving the gripper arms 382 in a direction closer to each other and in a direction away from each other. Although not shown in detail, the gripper driving unit 390 may be configured using a motor providing rotational force, a power transmission device such as a rack and a pinion, or a pneumatic cylinder. However, since the detailed configuration of the gripper driving unit 390 can be variously changed, the scope of the present invention will not be limited thereby.

Further, as an example, the gripper arm 382 may include a pair of finger members 384 for vacuum adsorbing the rear surface edge portions of the die 22, and each of the finger members 384 may include a vacuum hole 386 for gripping the rear surface edge portion of the die 22.

FIGS. 9 to 11 are schematic diagrams for describing the operation of the non-contact picker and the vacuum gripper shown in FIG. 2.

Referring to FIG. 9, the non-contact picker 300 may be arranged under the gripper driving unit 390, and the gripper arms 382 may be arranged on both sides of the non-contact picker 300, respectively. In particular, the die pickup module 100 may include a vertical driving unit 400 for moving the non-contact picker 300 in a vertical direction to pick up the die 22, and the vertical driving unit 400 may be mounted in the lower portion of the gripper driving unit 390.

After the die 22 is supported in a non-contact state by the non-contact picker 300, the vertical driving unit 400 may raise the non-contact picker 300, and then the gripper driving unit 390 may move the gripper arms 382 in a direction closer to each other as shown in FIG. 10. Accordingly, the finger members 384 of the gripper arms 382 may be positioned under the die, and as shown in FIG. 11, and the vertical driving unit 400 may descend the non-contact picker 300 to place the die 22 on the finger members 384. After the die 22 is placed on the finger members 384, the finger members 384 may vacuum adsorb the rear surface edge portions of the die 22 using the vacuum holes 386.

After the rear surface portions of the die 22 are vacuum adsorbed by the finger members 384, the inverting driving unit 410 may invert the non-contact picker 300 and the vacuum gripper 380, and the horizontal driving unit 420 may move the non-contact picker 300 and the vacuum gripper 380 in a horizontal direction to transmit the inverted die 22 to the die bonding module 500.

The bonding head 520 may vacuum adsorb the rear surface of the die 22 transferred by the horizontal driving unit 420 to pick up the die 22. Subsequently, the vacuum adsorption state of the die 22 by the finger members 384 may be released, and the gripper driving unit 390 may move the gripper arms 382 in a direction away from each other to complete the transmission of the die 22. After the die 22 is transmitted as described above, the bonding head 520 may bond the die 22 so that the front surface of the die 22 is attached onto the substrate 30.

Meanwhile, as shown in FIG. 2, the die pickup module 100 may include a second vertical driving unit 402 for moving the non-contact picker 300 and the vacuum gripper 380 in a vertical direction. That is, the non-contact picker 300 and the vacuum gripper 380 may be descended to a preset position by the second vertical driving unit 402, and then the vertical driving unit 400 may descend the non-contact picker 300 to a preset pickup position to pick up the die 22.

FIG. 12 is a schematic diagram for describing another example of the non-contact picker and the vacuum gripper shown in FIG. 2.

Referring to FIG. 12, the die pickup module 100 may comprise a vertical driving unit 430 for moving the non-contact picker 300 in a vertical direction to pick up the die 22, and a horizontal driving unit 440 for moving the vacuum gripper 380 in a horizontal direction to receive the die 22 picked up by the non-contact picker 300 and transmit the die 22 to the die bonding module 500. That is, the non-contact picker 300 and the vacuum gripper 380 are not integrally configured, but may be configured to be movable in a vertical direction and a horizontal direction by the vertical driving unit 430 and the horizontal driving unit 440, respectively.

FIG. 13 is a schematic cross-sectional view for describing the die ejector shown in FIG. 2, FIG. 14 is a schematic plan view for describing the ejector members and flanges shown in FIG. 13, and FIG. 15 is a schematic plan view for describing the driving head shown in FIG. 13.

Referring to FIGS. 13 to 15, the die ejector 200 may be in close contact with the lower surface of the dicing tape 24, and may include ejector members 210; 210a, 210b, and 210c arranged in a telescope shape and an ejector driving unit 220 for simultaneously raising ejector members 210, and then sequentially descending the ejector members 210 one by one from the outside to the inside.

For example, the ejector driving unit 220 may include disk-shaped flanges 222; 222a, 222b, 222c formed on a lower end of the ejector members 210 in a horizontal direction, arranged in a vertical direction, and having a diameter gradually increasing upward, a driving head 224 arranged in a lower portion of the flanges 222 and having upper surfaces in a circular ring shape respectively facing the lower surfaces of the flanges 222, a head driving unit 226 for rotating the head 224, cam followers 234 mounted on the lower portion of the flanges 222 and placed on the upper surfaces of the driving head 224. In particular, the upper surfaces of the driving head 224 may include first inclined surfaces 224b for simultaneous raise of the ejector members 210 and second inclined surfaces for sequential descend of the ejector members 224d.

Further, the die ejector 200 may include a hood 240 having an opening 244, into which the ejector members 210 are inserted, and vacuum holes 246 for vacuum adsorbing the dicing tape 24, and an ejector body 250 coupled to the lower portion of the hood 240 and in a cylindrical shape with the closed lower portion. The hood 240 may include an upper disk 242, in which the openings 244 and vacuum holes 246 are formed, and a hood body 248 in a circular tube shape coupled to the upper disk 242. Although not shown, a vacuum pump (not shown) may be connected to the ejector body 250, thereby vacuum pressure for vacuum adsorbing the dicing tape 24 may be provided inside the hood 240 and the ejector body 250. The opening 244 may have a square shape, and the vacuum holes 246 may be formed passing through around the opening 244 to vacuum adsorb the dicing tape 24.

The flanges 222 may be arranged inside the hood 240, and the ejector members 210 may extend upward from the flanges 222 through the opening 244. The ejector members 210 may have a square tube shape and may be arranged in a telescope shape. In particular, the ejector members 210 may be arranged to be spaced apart from each other by a predetermined distance, which provides a vacuum pressure between the ejector members 210 and inside the innermost ejector member 210c to partially separate the die 22 from the dicing tape 24 by the vacuum pressure when 210 the ejector members are raised.

According to an embodiment of the present invention, the die ejector 200 may include stopper members 212 arranged between the ejector members 210 to maintain a gap between the ejector members 210 and prevent rotation of the ejector members 210. Meanwhile, the outermost ejector member 210a may have a size smaller than that of the die 22, thereby when the ejector members 210 rise, the edge portion of the die 22 can be separated from the dicing tape 24. As shown, three ejector members 210a, 210b, and 210c are used, but the number of ejector members 210 may be variously changed.

The flanges 222 may be respectively formed in the lower portion of the ejector members 210 and may have a disk shape. As an example, as shown, the flanges 222 has a gradually increasing diameter from the lowermost flange 222c formed in the lower portion of the innermost ejector member 210c toward the uppermost flange 222a formed in the lower portion of the outermost ejector member 210a and can be stacked in a vertical direction. The driving head 224 may have a stepped recess corresponding to the flanges 222, and upper surfaces of the driving head 224 may each have a circular ring shape.

According to an embodiment of the present invention, roller-shaped cam followers 234 may be mounted in the lower portion of the flanges 222, and the cam followers 234 may be placed on the upper surfaces of the driving head 224. For example, two cam followers 234 may be respectively mounted on the flanges 222 as shown.

The upper surfaces of the driving head 224 may include first inclined surfaces 224b for raising the ejector members 210 and second inclined surfaces 224d for descending the ejector members 210, respectively. In addition, the upper surfaces of the driving head 224 may comprise first horizontal surfaces 224a arranged between lower portions of the first and second inclined surfaces 224b and 224d and second horizontal surfaces 224c arranged between the upper portions of the first and second inclined surfaces 224b and 224d.

The ejector driving unit 220 may include a head driving unit 226 for rotating the driving head 224, and the ejector members 210 may be elevated by rotation of the driving head 224. The head driving unit 226 may include a driving shaft 228 that passes through the lower portion of the ejector body 250 and is connected to the driving head 224. Further, the head driving unit 226 may include a motor 230 for rotating the driving shaft 228 and a power transmission device 232 for transmitting the rotational force of the motor 230 to the driving shaft 228.

The first and second inclined surfaces 224b and 224d of the driving head 224 may be configured such that all of the ejector members 210 simultaneously rise and sequentially descend one by one from the outermost ejector member 310a to the inside. For example, as shown, the first inclined surfaces 224b may be arranged at the same angle, and when the driving head 224 rotates clockwise, the ejector members 210 may be simultaneously raised. The second inclined surfaces 224d may be arranged to be spaced apart from the first inclined surfaces 224b by a predetermined angle in a clockwise direction. Accordingly, when the driving head 224 rotates in a clockwise direction, the ejector members 210 may be sequentially descended one by one from the outermost ejector member 210a to the inside.

Meanwhile, the driving head 224 may include a permanent magnet 236 that provides a magnetic force so that the cam followers 234 are in close contact with the upper surfaces of the driving head 224. Accordingly, the ejector members 210 may be elevated along the first and second inclined surfaces 224b and 224d by the rotation of the driving head 224. As an example, a circular ring shaped permanent magnet 236 may be embedded in the driving head 224.

Although not shown, different from the above, according to another embodiment of the present invention, the ejector members 210 may be elevated by separate ejector driving units (not shown), respectively. For example, the ejector driving units may be each configured using a linear driving device including a motor and a linear motion guide, and may be configured using pneumatic cylinders differently.

FIGS. 16 to 20 are schematic diagrams for describing a method of picking up a die using the non-contact picker and die ejector shown in FIG. 2.

Referring to FIG. 16, the die ejector 200 may be positioned in the lower portion of the die 22 to be picked up. In this case, the cam followers 234 may be positioned on the first horizontal surfaces 224a of the driving head 224, thereby the ejector members 210 may all be in a descended state. In the hood 240, a vacuum may be provided to vacuum adsorb the dicing tape 24 on the hood 240 and the ejector members 210, and the vacuum may be transmitted to the vacuum holes 246 as well as between the ejector members 210 and inside the innermost ejector unit 112c.

Referring to FIG. 17, the driving head 224 may be rotated by a predetermined angle in a clockwise direction, thereby the cam followers 234 may be moved onto the second horizontal surfaces 224c by passing through the first inclined surfaces 224b of the driving head 224. As a result, all of the ejector members 210 may be simultaneously raised so as to protrude from the hood 240, thereby the die 22 may be raised. In this case, remaining portions of the die 22 except for portions supported by the ejector members 210 may be separated from the dicing tape 24.

Subsequently, the non-contact picker 300 may be descended by the vertical driving unit 400 to a die pickup position spaced apart from the front surface of the die 22 by a predetermined distance, and the die 22 may be supported in a non-contact state by the non-contact picker 300 by repulsive force generated by the ultrasonic vibration units 310, 312, 340, 360 and suction force generated by the vacuum chuck 320 and 350 or the Bernoulli chuck 330 and 370.

Referring to FIGS. 18 to 20, the ejector members 210 may be sequentially descended one by one from the outermost ejector member 210a to the inside by rotation of the driving head 224, thereby the die 22 can be completely separated from the dicing tape 24. Specifically, the cam followers 234 may be moved onto the first horizontal surfaces 224a by passing through the second inclined surfaces 224d of the driving head 224 by rotation of the driving head 224. Thereby, the ejector members 210 may be sequentially descended one by one from the outside to the inside.

On the other hand, although not shown, in order to reduce the attachment area between the die 22 and the dicing tape 24 in a state where the die 22 is raised, a plurality of ejector pins (not shown) may be provided on the upper surface of the ejector members 210. In this case, since the adhesive force between the die 22 and the dicing tape 24 can be sufficiently reduced by the ejector pins in a state where the ejector members 210 are raised, the die 22 may be more easily separated from the dicing tape 24 than when the ejector members 210 are descended.

As described above, after the die 22 is completely separated from the dicing tape 24, the vertical driving unit 400 may raise the non-contact picker 300, and the die 22 may be transmitted onto the vacuum gripper 380. The inverting driving unit 410 may invert the die 22 so that the rear surface of the die 22 faces upward by inverting the vacuum gripper 380. Subsequently, the horizontal driving unit 420 may move the vacuum gripper 380 to a position adjacent to the die bonding module 500, and the bonding head 520 may pick up the inverted die 22 and bond it on the substrate 30.

According to the embodiments of the present invention as described above, the non-contact picker 300 may pick up the die 22 in a non-contact manner using the repulsive force provided by the ultrasonic vibration unit 310, 312, 340, 360 and the suction force provided by the vacuum chucks 320, 350 and or the Bernoulli chucks 330, 370 and the picked up die 22 may be transmitted onto the vacuum gripper 380. The vacuum gripper 380 may partially vacuum adsorb the rear surface of the die 22, and the inverting driving unit 410 may invert the vacuum gripper 380 to invert the die 22. The bonding head 520 may pick up the rear surface of the inverted die 22 by vacuum adsorption, and may perform a bonding step such that the front surface of the die 22 is attached onto the substrate 30. As described above, contamination of the front surface portion of the die 22 can be prevented by inverting the die 22 in a state where the die 22 is picked up in a non-contact manner and the rear surface of the die 22 is vacuum adsorbed, Accordingly, a bonding failure due to contamination of the front surface portion of the die 22 or an electrical defect between electrode pads due to contamination may be sufficiently prevented.

Although the above has been described with reference to the preferred embodiments of the present invention, it could be understood that those skilled in the art can variously modify and change the present invention without departing from the spirit and scope of the present invention recited in the following claims.

REFERENCE NUMERALS

10: die bonding apparatus 20: wafer
22: die 24: dicing tape
100: die pickup module 110: wafer stage
200: die ejector 210: ejector member
220: ejector driving unit 222: flange
224: driving head 226: head driving unit
234: cam follower 236: permanent magnet
240: hood 244: opening
246: vacuum hole 250: ejector body
300: non-contact picker 310: ultrasonic vibration unit
320: vacuum chuck 330: Bernoulli chuck
380: vacuum gripper 382: gripper arm
384: finger member 390: gripper driving unit
400: vertical driving unit 402: second vertical driving unit
410: inverting driving unit 420: horizontal driving unit
500: die bonding module 510: substrate stage
520: bonding head

What is claimed is:

1. A die pickup module comprising:
a wafer stage for supporting a wafer including dies attached on a dicing tape;
a die ejector arranged under the dicing tape and for separating a die to be picked up from the dicing tape;
a non-contact picker for picking up the die from the dicing tape in a non-contact manner so as not to contact a front surface of the die;
a vacuum gripper for partially vacuum adsorbing a rear surface of the die picked up by the non-contact picker, the vacuum gripper including a gripper arm configured in a fork shape, the gripper arm including finger members each having a vacuum hole for vacuum adsorbing rear surface edge portions of the die; and
an inverting driving unit for inverting the vacuum gripper to invert the die gripped by the vacuum gripper.

2. The die pickup module of claim 1,
wherein the non-contact picker comprises an ultrasonic vibration unit for maintaining the die in a non-contact state using ultrasonic vibration.

3. The die pickup module of claim 2,
wherein the ultrasonic vibration unit comprises an ultrasonic vibrator for generating the ultrasonic vibration, a horn for transmitting the ultrasonic vibration and a vibration plate connected to the horn and vibrated by the ultrasonic vibration.

4. The die pickup module of claim 1,
wherein the non-contact picker comprises an ultrasonic vibration unit that provides repulsive force for pushing the die using ultrasonic vibration and a vacuum chuck that provides suction force to the die using vacuum pressure so that the die is maintained in a non-contact state.

5. The die pickup module of claim 4,
wherein the vacuum chuck is coupled to an end of the ultrasonic vibration unit and has vacuum holes for forming the suction force,
wherein the vacuum holes are connected to a vacuum pump through a vacuum line passing through the ultrasonic vibration unit.

6. The die pickup module of claim 4,
wherein the ultrasonic vibration unit comprises an ultrasonic vibrator for generating the ultrasonic vibration, a horn for transmitting the ultrasonic vibration and a vibration plate connected to the horn and vibrated by the ultrasonic vibration.

7. The die pickup module of claim 1,
wherein the non-contact picker comprises an ultrasonic vibration unit that provides repulsive force for pushing the die using ultrasonic vibration and a Bernoulli chuck that forms a flow of air on the die so that the die is maintained in a non-contact state and provides suction force to the die by using negative pressure generated by the flow of air.

8. The die pickup module of claim 7,
wherein the Bernoulli chuck has an air injection nozzle coupled to an end of the ultrasonic vibration unit and for forming the flow of air, and vacuum holes for sucking air injected from the air injection nozzle,
wherein the air injection nozzle is connected to an air supplying unit for supplying the air through an air line passing through the ultrasonic vibration unit.

9. The die pickup module of claim 7,
wherein the ultrasonic vibration unit comprises an ultrasonic vibrator for generating the ultrasonic vibration, a horn for transmitting the ultrasonic vibration and a vibration plate connected to the horn and vibrated by the ultrasonic vibration.

10. The die pickup module of claim 1,
wherein the gripper arm comprises a pair of gripper arms for vacuum adsorbing rear surface edge portions of the die and a gripper driving unit for moving the gripper arms in a direction closer to each other and a direction away from each other.

11. The die pickup module of claim 10 further comprising,
a vertical driving unit mounted on the gripper driving unit and for moving the non-contact picker in a vertical direction to pick up the die.

12. The die pickup module of claim 1 further comprising,
a vertical driving unit for moving the non-contact picker in a vertical direction to pick up the die; and
a horizontal driving unit for moving the vacuum gripper in a horizontal direction to receive the die picked up by the non-contact picker.

13. The die pickup module of claim 1,
wherein the die ejector comprises ejector members arranged in a telescope shape and an ejector driving unit for simultaneously raising the ejector members and sequentially descending the ejector members one by one from outside to inside.

14. The die pickup module of claim 13,
wherein the ejector driving unit comprises,
disk-shaped flanges formed at a lower end of the ejector members in a horizontal direction, arranged in a vertical direction, and having a diameter gradually increasing upward;
a driving head arranged in a lower portion of the flanges and having circular ring-shaped upper surfaces respectively facing lower surfaces of the flanges;
a head driving unit for rotating the driving head; and cam followers mounted in a lower portion of the flanges and placed on upper surfaces of the driving head, wherein the upper surfaces of the driving head include first inclined surfaces for simultaneous raise of the ejector members and second inclined surfaces for sequential descend of the ejector members.

15. The die pickup module of claim 13, wherein the die ejector further comprises stopper members for maintaining a gap between the ejector members.

16. The die pickup module of claim 13, wherein the die ejector further comprises a hood having an opening, into which the ejector members are inserted, and vacuum holes for vacuum adsorbing the dicing tape, and an ejector body coupled to the hood and in a cylinder shape with a closed lower portion.

17. A die pickup module comprising:

a wafer stage for supporting a wafer including dies attached on a dicing tape;

a die ejector arranged under the dicing tape and for separating a die to be picked up from the dicing tape;

a non-contact picker for picking up the die from the dicing tape in a non-contact manner so as not to contact a front surface of the die;

a vacuum gripper for partially vacuum adsorbing a rear surface of the die picked up by the non-contact picker; and an inverting driving unit for inverting the vacuum gripper to invert the die gripped by the vacuum gripper, wherein the die ejector comprises ejector members arranged in a telescope shape and an ejector driving unit for simultaneously raising the ejector members and sequentially descending the ejector members one by one from outside to inside, wherein the ejector driving unit comprises, disk-shaped flanges formed at a lower end of the ejector members in a horizontal direction, arranged in a vertical direction, and having a diameter gradually increasing upward;

a driving head arranged in a lower portion of the flanges and having circular ring-shaped upper surfaces respectively facing lower surfaces of the flanges;

a head driving unit for rotating the driving head; and cam followers mounted in a lower portion of the flanges and placed on upper surfaces of the driving head, wherein the upper surfaces of the driving head include first inclined surfaces for simultaneous raise of the ejector members and second inclined surfaces for sequential descend of the ejector members, and wherein the driving head comprises a permanent magnet for providing magnetic force so that the cam followers are in close contact with upper surfaces of the driving head.

18. A die bonding apparatus comprising:

a die pickup module for picking up a die to be picked up from a wafer including dies attached on a dicing tape and inverting the picked up die; and a die bonding module for bonding a die inverted by the die pickup module on a substrate, wherein the die pickup module comprises:

a wafer stage for supporting the wafer;

a die ejector arranged under the dicing tape and for separating the die from the dicing tape;

a non-contact picker for picking up the die in a non-contact manner so as not to contact with a front surface of the die;

a vacuum gripper for partially vacuum adsorbing a rear surface of the die picked up by the non-contact picker, the vacuum gripper including a gripper arm configured in a fork shape, the gripper arm including finger members each having a vacuum hole for vacuum adsorbing rear surface edge portions of the die; and an inverting driving unit for inverting the vacuum gripper to invert the die so that a rear surface of the die gripped by the vacuum gripper faces upward.

* * * * *